United States Patent
Chun et al.

(10) Patent No.: US 9,633,698 B2
(45) Date of Patent: Apr. 25, 2017

(54) DYNAMIC CONTROL OF SIGNALING POWER BASED ON AN ERROR RATE

(71) Applicant: QUALCOMM Incorporated, San Diego, CA (US)

(72) Inventors: Dexter Tamio Chun, San Diego, CA (US); Vaishnav Srinivas, San Diego, CA (US); David Ian West, San Diego, CA (US); Deepti Vijayalakshmi Sriramagiri, San Diego, CA (US); Jungwon Suh, San Diego, CA (US); Jason Thurston, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 197 days.

(21) Appl. No.: 14/280,313

(22) Filed: May 16, 2014

(65) Prior Publication Data

US 2015/0332735 A1 Nov. 19, 2015

(51) Int. Cl.
| | |
|---|---|
| *G06F 11/00* | (2006.01) |
| *G11C 5/14* | (2006.01) |
| *G06F 11/07* | (2006.01) |
| *G06F 11/10* | (2006.01) |
| *G01R 31/317* | (2006.01) |

(52) U.S. Cl.
CPC .......... *G11C 5/147* (2013.01); *G06F 11/076* (2013.01); *G06F 11/1004* (2013.01); *G01R 31/3171* (2013.01); *G01R 31/31709* (2013.01)

(58) Field of Classification Search
CPC .... G11C 5/147; G06F 11/076; G06F 11/1004; G01R 31/3171; G01R 31/31709
See application file for complete search history.

(56) References Cited

U.S. PATENT DOCUMENTS

| | | | |
|---|---|---|---|
| 6,182,264 B1* | 1/2001 | Ott | 714/774 |
| 7,483,768 B2* | 1/2009 | Chou | 700/298 |
| 2004/0030965 A1* | 2/2004 | Hadjihassan et al. | 714/704 |
| 2006/0028850 A1* | 2/2006 | Brooks | H02M 3/1584 363/65 |
| 2007/0120588 A1* | 5/2007 | Lim | G06F 1/10 327/291 |
| 2008/0298313 A1* | 12/2008 | Salminen | H04L 63/08 370/329 |
| 2010/0231233 A1 | 9/2010 | Dasnurkar | |
| 2012/0072784 A1 | 3/2012 | Li et al. | |
| 2013/0259155 A1 | 10/2013 | Takatori et al. | |

OTHER PUBLICATIONS

International Search Report and Written Opinion—PCT/US2015/026597—ISA/EPO—Jul. 21, 2015.

* cited by examiner

*Primary Examiner* — Guy Lamarre
(74) *Attorney, Agent, or Firm* — Muncy, Geissler, Olds & Lowe, P.C.

(57) ABSTRACT

Writing to and reading from dynamic random access memory (DRAM) by a system on chip (SoC) over a multiphase multilane memory bus has power consumption optimized based on bit error rate (BER) and one or more thresholds. The bit error rate (BER) may be measured and used to control parameters to achieve optimal balance between power consumption and accuracy. The bit error rate (BER) measurement, purposely adding jitter, and checking against the thresholds is performed during normal mission-mode operation with live traffic. Error detection may cover every memory data transaction that has a block of binary data.

30 Claims, 9 Drawing Sheets

WRITE PATH

*READ PATH*

WIRE STATE GENERATION USING SYSMBOL TO LINE STATE MODULATOR
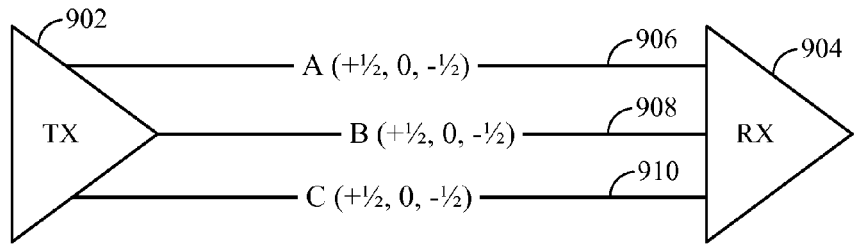
FIG. 9A
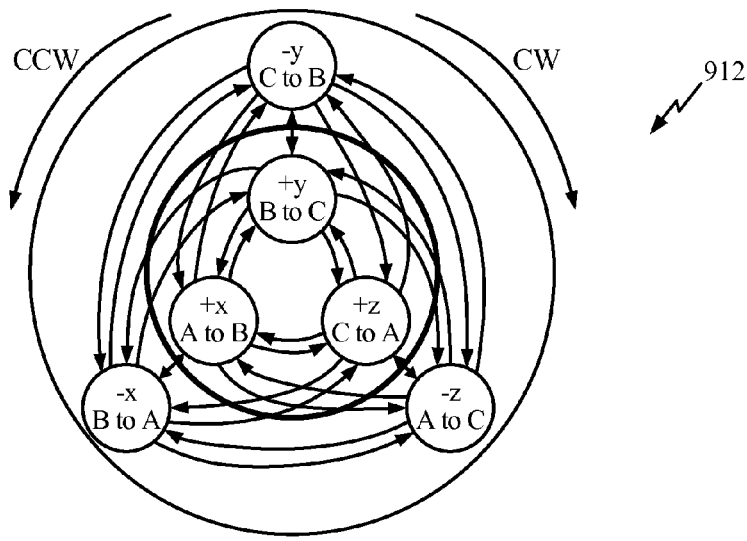
FIG. 9B
| Symbol Input Value | Previous Wire State | | | | | | What Happens |
|---|---|---|---|---|---|---|---|
| | +x {000} | -x {001} | +y {010} | -y {011} | +z {100} | -z {101} | |
| 000 | +z {100} | -z {101} | +x {000} | -x {001} | +y {010} | -y {011} | Rotate CCW, polarity is Same |
| 001 | -z {101} | +z {100} | -x {001} | +x {000} | -y {011} | +y {010} | Rotate CCW, polarity is Opposite |
| 010 | +y {010} | -y {011} | +z {100} | -z {101} | +x {000} | -x {001} | Rotate CW, polarity is Same |
| 011 | -y {011} | +y {010} | -z {101} | +z {100} | -x {001} | +x {000} | Rotate CW, polarity is Opposite |
| 1xx | -x {001} | +x {000} | -y {011} | +y {010} | -z {101} | +z {100} | Same phase, polarity is Opposite |
FIG. 9C

DYNAMIC CONTROL OF SIGNALING POWER BASED ON AN ERROR RATE

FIELD OF DISCLOSURE

Aspects of the present disclosure relate generally to wired links, and in particular to dynamic control of signaling power over a wired link based on an error rate.

BACKGROUND

Portable consumer devices such as cellular phones, tablets, laptops, personal digital assistant (PDA), smart phones, entertainment devices, and the like commonly benefit from reduced power consumption. Three-phase signaling is a conventional technique used to lower power consumption when transmitting data between processors in devices.

Three-phase signaling also is being introduced as a candidate solution for transmitting data on a multilane memory bus. However, improved apparatuses and methods for reducing power on a multilane three-phase memory bus are still needed.

SUMMARY

Example implementations of the technology described herein are directed to apparatuses, methods, and computer-readable media for optimizing power consumption in a platform based on a bit error rate (BER) and one or more thresholds.

In one or more implementations, a method for optimizing power consumption in a platform having a multilane, multiphase bus includes setting an accuracy parameter for the platform, introducing a first amount of jitter into the platform, determining whether a bit error rate (BER) in the platform exceeds a bit error rate (BER) threshold value, and determining whether the first amount of jitter exceeds a jitter threshold value. If the measured BER does not exceed the bit error rate (BER) threshold value and the first amount of introduced jitter does not exceed the jitter threshold value, then the method operates by increasing an amount of jitter introduced into the platform until the bit error rate (BER) in the platform exceeds the bit error rate (BER) threshold value and increasing the amount of jitter introduced into the platform exceeds the jitter threshold value. If the measured bit error rate (BER) does not exceed the BER threshold value and the first amount of introduced jitter exceeds the jitter threshold value, then the method operates by adjusting the accuracy parameter and increasing an amount of jitter introduced into the platform until the bit error rate (BER) in the platform exceeds the bit error rate (BER) threshold value and the amount of jitter introduced into the platform exceeds the jitter threshold value.

In one or more implementations, an apparatus for optimizing power consumption in a platform having a multilane, multiphase bus includes logic that is configured to set an accuracy parameter for the platform, logic that is configured to introduce a first amount of jitter into the platform, logic that is configured to determine whether a bit error rate (BER) in the platform exceeds a BER threshold value, and logic that is configured to determine whether the first amount of jitter exceeds a jitter threshold value.

The apparatus also includes logic that is configured to, if the measured bit error rate (BER) does not exceed the bit error rate (BER) threshold value and the first amount of introduced jitter does not exceed the jitter threshold value, increase an amount of jitter introduced into the platform until the bit error rate (BER) in the platform exceeds the bit error rate (BER) threshold value and the amount of jitter introduced into the platform exceeds the jitter threshold value. The apparatus also includes logic that is configured to, if the measured bit error rate (BER) does not exceed the bit error rate (BER) threshold value and the first amount of introduced jitter exceeds the jitter threshold value, adjust the accuracy parameter and increase an amount of jitter introduced into the platform until the bit error rate (BER) in the platform exceeds the bit error rate (BER) threshold value and the amount of jitter introduced into the platform exceeds the jitter threshold value.

In one or more implementations, the apparatus further includes logic that is configured to provide data, logic that is configured to provide a check value for the data, logic that is configured to provide a code word having the data and the check value, and logic that is configured to modulate the code word and to transmit the code word to the multilane, multiphase bus at the measured bit error rate (BER).

In one or more implementations, the apparatus further includes logic that is configured to obtain a code word from the multilane, multiphase bus. The code word includes a check value, and the code word is obtained at the measured bit error rate (BER). The apparatus further includes logic that is configured to remove the check value from the code word and logic that is configured to demodulate and transmit the code word across a channel at the measured bit error rate (BER).

In one or more implementations, an apparatus for optimizing power consumption in a platform having a multilane, multiphase bus includes means for setting an accuracy parameter for the platform, means for introducing a first amount of jitter into the platform, means for determining whether a bit error rate (BER) in the platform exceeds a bit error rate (BER) threshold value, and means for determining whether the first amount of jitter exceeds a jitter threshold value. The apparatus also includes means for, if the measured bit error rate (BER) does not exceed the bit error rate (BER) threshold value and the first amount of introduced jitter does not exceed the jitter threshold value, increasing an amount of jitter introduced into the platform until the bit error rate (BER) in the platform exceeds the bit error rate (BER) threshold value and the amount of jitter introduced into the platform exceeds the jitter threshold value.

The apparatus further includes means for, if the measured bit error rate (BER) does not exceed the BER threshold value and the first amount of introduced jitter exceeds the jitter threshold value, adjusting the accuracy parameter and increasing an amount of jitter introduced into the platform until the bit error rate (BER) in the platform exceeds the bit error rate (BER) threshold value and the amount of jitter introduced into the platform exceeds the jitter threshold value.

In one or more implementation, a method for optimizing power consumption in a platform having a multilane, multiphase bus includes step for setting an accuracy parameter for the platform, step for introducing a first amount of jitter into the platform, step for determining whether a bit error rate (BER) in the platform exceeds a BER threshold value, and step for determining whether the first amount of jitter exceeds a jitter threshold value.

The method also includes step for, if the measured bit error rate (BER) does not exceed the bit error rate (BER) threshold value and the first amount of introduced jitter does not exceed the jitter threshold value, then increasing an amount of jitter introduced into the platform until the bit error rate (BER) in the platform exceeds the bit error rate (BER) threshold value and the amount of jitter introduced into the platform exceeds the jitter threshold value. The method also includes step for, if the measured bit error rate (BER) does not exceed the bit error rate (BER) threshold value and the first amount of introduced jitter exceeds the jitter threshold value, then adjusting the accuracy parameter and increasing an amount of jitter introduced into the platform until the bit error rate (BER) in the platform exceeds the bit error rate (BER) threshold value and the amount of jitter introduced into the platform exceeds the jitter threshold value.

Above is a simplified Summary relating to one or more implementations described herein. As such, the Summary should not be considered an extensive overview relating to all contemplated aspects and/or implementations, nor should the Summary be regarded to identify key or critical elements relating to all contemplated aspects and/or implementations or to delineate the scope associated with any particular aspect and/or implementation. Accordingly, the Summary has the sole purpose of presenting certain concepts relating to one or more aspects and/or implementations relating to the mechanisms disclosed herein in a simplified form to precede the detailed description presented below.

BRIEF DESCRIPTION OF THE DRAWINGS

The accompanying drawings are presented to aid in the description of the technology described herein and are provided solely for illustration of the implementations and not for limitation of the implementations.

FIGS. 9A, 9B, and 9C illustrate generation of three-phase wire states using the modulator depicted in FIG. 6 according to one or more implementations of the technology described herein

DETAILED DESCRIPTION

In general, the subject matter disclosed herein is directed to systems, methods, apparatuses, and computer-readable media for writing to and reading from a memory, such as a dynamic random access memory (DRAM), by a system on chip (SoC) over a multiphase multilane memory bus in a device platform. The technology described herein optimizes power consumption in the multiphase multilane memory bus based on the bit error rate (BER) and one or more thresholds for the platform.

An adjustment in platform bit error rate (BER) with respect to a minimum and a maximum threshold will invoke an accuracy parameter adjustment to increase or decrease platform accuracy. During any accuracy parameter adjustment a fine bit error rate (BER) measurement using platform jitter is performed. Measuring bit error rate (BER), purposely adding jitter, and checking against the thresholds is performed during normal mission-mode operation with live traffic. Accuracy parameters to be adjusted may include rotators, coding techniques, and mappers, for example. Adjusting one or more accuracy parameters may worsen power consumption and improve accuracy. Alternatively adjusting one or more accuracy parameters may improve power consumption and worsen accuracy. A trade-off is made to optimize power consumption versus accuracy.

Platform Write Path

Figure 1:
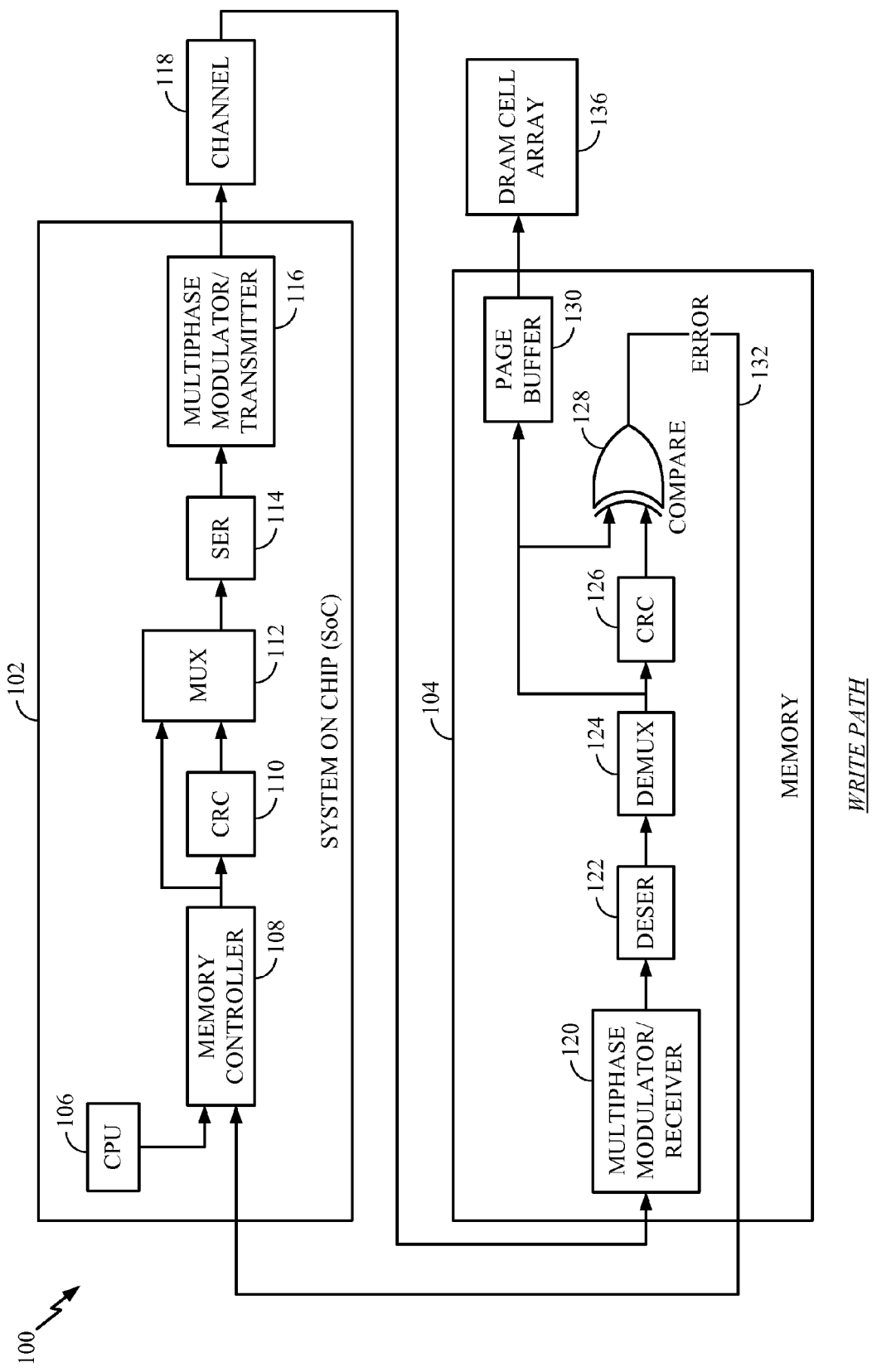
FIG. 1 is a block diagram of a write path between a system on chip (SoC) and a memory according to one or more implementations of the technology described herein.

FIG. 1 is a block diagram of a platform write path 100 according to one or more implementations of the technology described herein. In one or more implementations, the platform write path 100 may be any suitable device or part thereof that implements a multiphase multilane memory bus.

In the illustrated implementation, the write path 100 includes a system on chip (SoC) 102 and a memory 104. The system on chip (SoC) 102 includes a central processing unit (CPU) 106, a memory controller 108, a cyclic redundancy check (CRC) 110, a multiplexer (MUX) 112, a serializer (SER) 114, and a multiphase modulator/transmitter 116. The system on chip (SoC) 102 is coupled to the memory 104 using a channel 118. The memory 104 includes a multiphase modulator/receiver 120, a deserializer (DESER) 122, a demultiplexer (DEMUX) 124, a cyclic redundancy check (CRC) 126, an optional compare exclusive OR 128, a page buffer 130, and DRAM cell array 136.

In order for the illustrated system on chip (SoC) 102 to "write" data into the DRAM cell array 136, the data is formatted by the memory controller 108 and then passed to the cyclic redundancy check (CRC) 110 and to the multiplexer (MUX) 112 in parallel. The cyclic redundancy check (CRC) 110 creates one or more parity bit(s) (or check values) based on the data to be written. The multiplexer (MUX) 112 appends the parity bits to the data. The serializer (SER) 114 serializes (upconverts) the data and appended parity bits. This creates a code word.

The multiphase modulator/transmitter 116 modulates and transmits the code word across the channel 118 to the memory 104. The channel 118 may implement a multiphase, multilane bus. In one or more implementations, the multiphase modulator/transmitter 116 applies three-phase modulation to the code word. The three-phase symbols generated by the multiphase modulator/transmitter 116 may be transmitted over a multiphase multilane memory bus. The multiphase modulator/transmitter 116 may implement phase rotation, coding techniques, and/or mapping techniques.

At the memory 104 the multiphase modulator/receiver 120 demodulates the code word. The deserializer (DESER) 122 deserializes the demodulated code word. The demultiplexer (DEMUX) 124 strips the parity bit from the code word and sends the data to the page buffer 130 and to the cyclic redundancy check (CRC) 126. The cyclic redundancy check (CRC) 126 regenerates a cyclic redundancy check (CRC) parity bit (or check value) from the deserialized, demodulated data. The original parity bit that was appended to the data is compared against the regenerated parity bit. This may be accomplished using any suitable comparing technology, such as the compare exclusive OR 128.

The page buffer 130 may temporarily store a page of data. The data may be one of many sizes, including 2048 bytes consisting of 32 data blocks, each having a size of 64 bytes.

During transmission of data from the system on chip (SoC) 102 to the memory 104, errors may be introduced. If the original parity bit and the regenerated parity bit match, then there are no errors detected in the transmission. The data stored in the page buffer 130 of the memory 104 is eventually transferred into the DRAM cell array 136 when the DRAM page is closed.

If, on the other hand, the original parity bit and the regenerated parity bit do not match an error has occurred. In this case, the "write" transaction is aborted and an error signal 132 is sent back to the memory controller 108 to inform the memory controller 108 that it should resend the "write" transaction. The page buffer 130 ignores the temporarily stored data block after an abort. The system on chip (SoC) 102 resends the "write" transaction and only if no errors are detected is the data written from the page buffer 130 to the DRAM cell array 136.

Platform Read Path

Figure 2:
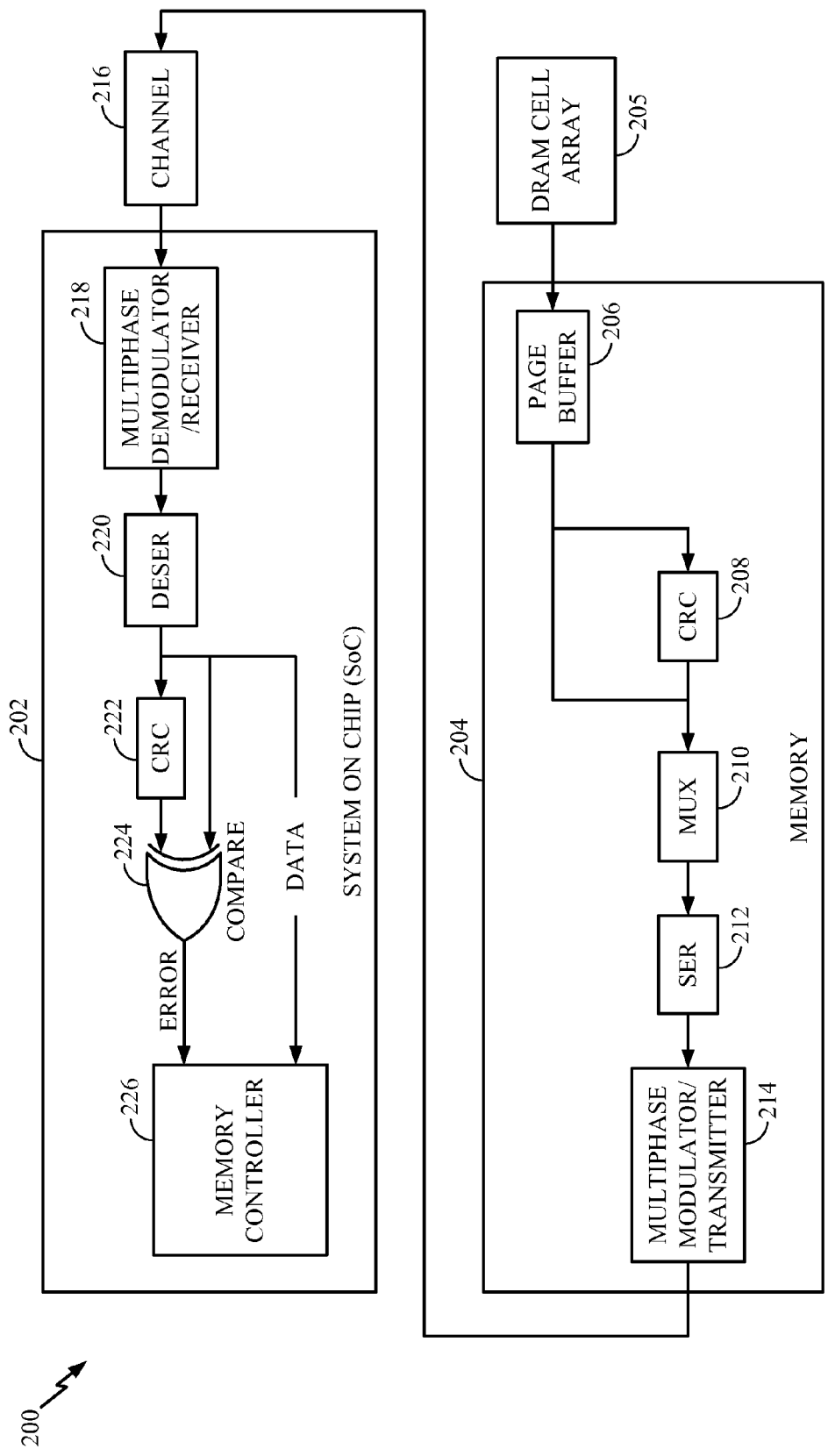
FIG. 2 is a block diagram of a read path between a system on chip (SoC) and a memory according to one or more implementations of the technology described herein.

FIG. 2 is a block diagram of a platform read path 200 between a system on chip (SoC) 202 and a memory 204 (e.g., a dynamic random access memory (DRAM)) according to one or more implementations of the technology described herein. In one or more implementations, the platform may be any suitable device or part thereof that implements a multiphase multilane memory bus.

In the illustrated implementation, the memory 204 includes a DRAM cell array 205, a page buffer 206, a cyclic redundancy check (CRC) 208, a multiplexer (MUX) 210, a serializer (SER) 212, a multiphase modulator/transmitter 214, a channel 216, a multiphase demodulator/receiver 218, a deserializer (DESER) 220, a cyclic redundancy check (CRC) 222, an optional compare exclusive OR 224, and a memory controller 226.

In one or more implementations, the DRAM cell array 205 transfers one page of data into the page buffer 206 corresponding to the data that the system on chip (SoC) 202 wants to read. In order for the illustrated system on chip (SoC) 202 to "read" data from the page buffer 206, the page buffer 206 sends the data to the cyclic redundancy check (CRC) 208 and the multiplexer (MUX) 210 in parallel. The cyclic redundancy check (CRC) 208 generates one or more parity bit(s) (or check value). The multiplexer (MUX) 210 appends the parity bits to the data to create a code word. The serializer 212 serializes (or upconverts) the code word. The multiphase modulator/transmitter 214 modulates and transmits the modulated code word to the system on chip (SoC) 202 across the channel 216. The channel 216 may implement a multiphase, multilane bus.

On the system on chip (SoC) 202 the multiphase demodulator/receiver 218 demodulates the code word. The deserializer (DESER) 220 deserializes the code word. A demultiplexer (not shown) strips the parity bit from the code word and sends the data to the cyclic redundancy check (CRC) 222, to the compare exclusive OR gate 224, and to the memory controller 226. The cyclic redundancy check (CRC) 222 regenerates a cyclic redundancy check (CRC) parity bit (or check value) from the data. The original parity bit is compared against the regenerated parity bit using any suitable comparing technology, such as the compare exclusive OR 224.

During transmission of the data from the page buffer 206 errors may be introduced. If the original parity bit and the regenerated parity bit match, then there are no errors detected in the transmission. The data is provided to the memory controller 226 for further use in the system on chip (SoC) 202.

If, on the other hand, the original parity bit and the regenerated parity bit do not match an error has occurred. In this case, the data is discarded and the SoC 202 retries the read operation. In one or more implementations, the read path 200 includes a separate control channel (not shown) that re-issues the "read" command in the event of an error.

Dynamic Bit Error Rate (BER) Measurement

Figure 3:
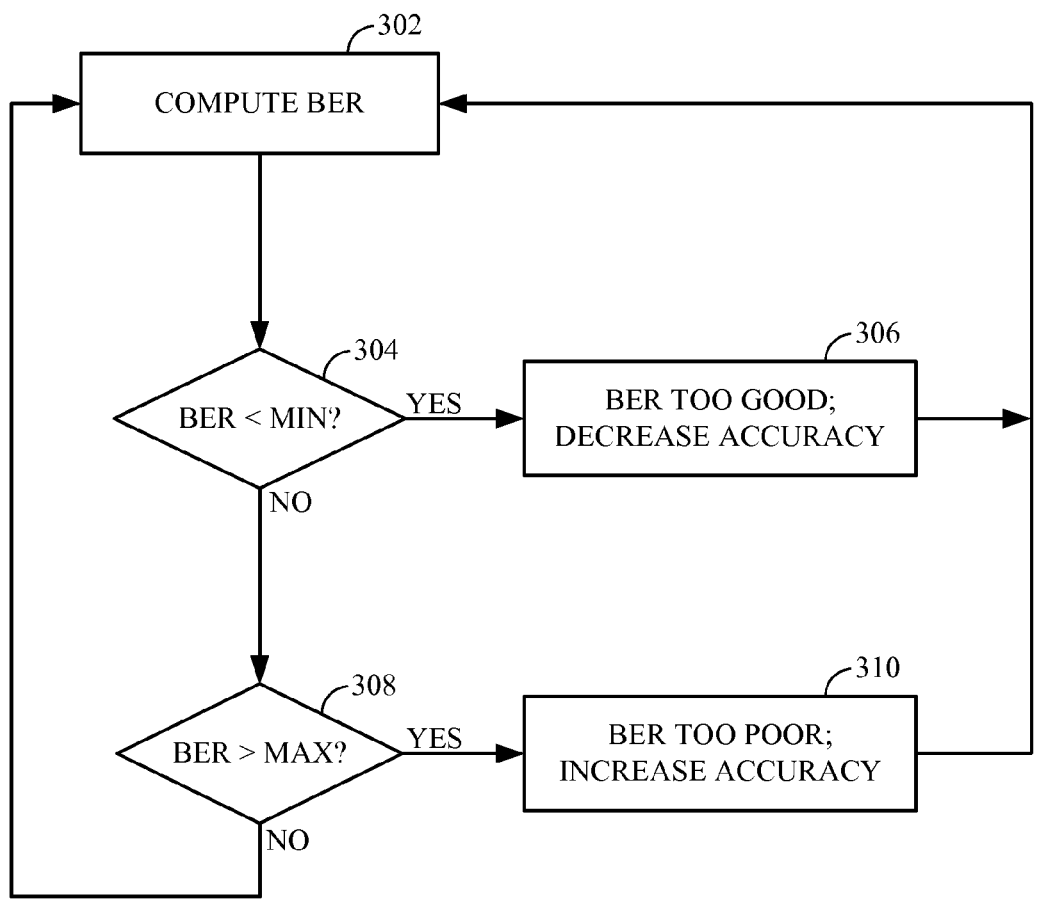
FIG. 3 is a flowchart illustrating dynamic bit error rate (BER) measurement according to one or more implementations of the technology described herein.

FIG. 3 is a flowchart illustrating a method 300 of dynamically measuring bit error rate (BER) in the platform write path 100 and the platform read path 200 (collectively "the platform") according to one or more implementations of the technology described herein. Measurement of the bit error rate (BER) may be performed during platform operation (e.g., with mission mode data traffic). An adjustment in platform bit error rate (BER) with respect to a minimum and a maximum threshold will invoke a parameter adjustment to increase or decrease platform accuracy. In this manner, an optimal balance between power consumption and bit error rate (BER) may be achieved.

In one or more implementations, error detection may cover every memory data transaction that includes a block of binary data. The bit error rate (BER) may be measured in both directions (receive and transmit) and may be used to control parameters in the hardware of the platform.

In a block 302, the method 300 computes the bit error rate (BER) for the platform. This is performed by counting the number of CRC mismatches (errors) and dividing it by the total number of code word bits transferred during a fixed time interval. For example, $$BER = (CRC\ mismatches) \div (code\ words\ sent * bits\ per\ code\ word)$$

In one or more implementations, bit error rate (BER) counters and calculations may be periodically reset at fixed time intervals or upon certain the occurrence of events. Such events may include making an adjustment to an accuracy setting, for example.

In a block 304, the method 300 determines whether the bit error rate (BER) is below a minimum threshold. If the bit error rate (BER) is below the minimum threshold, the method 300 determines that the bit error rate (BER) is too good and decreases the accuracy of the platform in block 306. In one or more implementations, the method 300 decreases the transmitter and receiver settings (e.g., transmit power; receive sensitivity) to degrade signaling accuracy. This allows for lower power consumption in the platform.

After the method decreases the accuracy of the platform in block 306, the method returns to block 302 and re-computes the bit error rate (BER).

If in block 304 it is determined that the bit error rate (BER) is not below a minimum threshold, in a block 308 it is determined whether the bit error rate (BER) is above a maximum threshold. If the bit error rate (BER) is above the maximum threshold, then the method 300 determines that the bit error rate (BER) is too poor and increases the accuracy of the platform in a block 310. Increasing the accuracy of the platform may cause an increase in power consumption. Increasing the accuracy of the platform may be accomplished by changing the transmitter and receiver settings.

After the method increases the accuracy of the platform in block 310, the method returns to block 302 and re-computes the bit error rate (BER).

In one or more implementations, when changing the transmitter and receiver settings jitter may be intentionally introduced into the platform to determine the accuracy of the platform, also known as timing margin, at these operating points. Also, the bit error rate (BER) for the platform write path 100 may be independent of the bit error rate (BER) for the platform read path 200.

Double Loop Intentional Jitter Introduction

Figure 4:
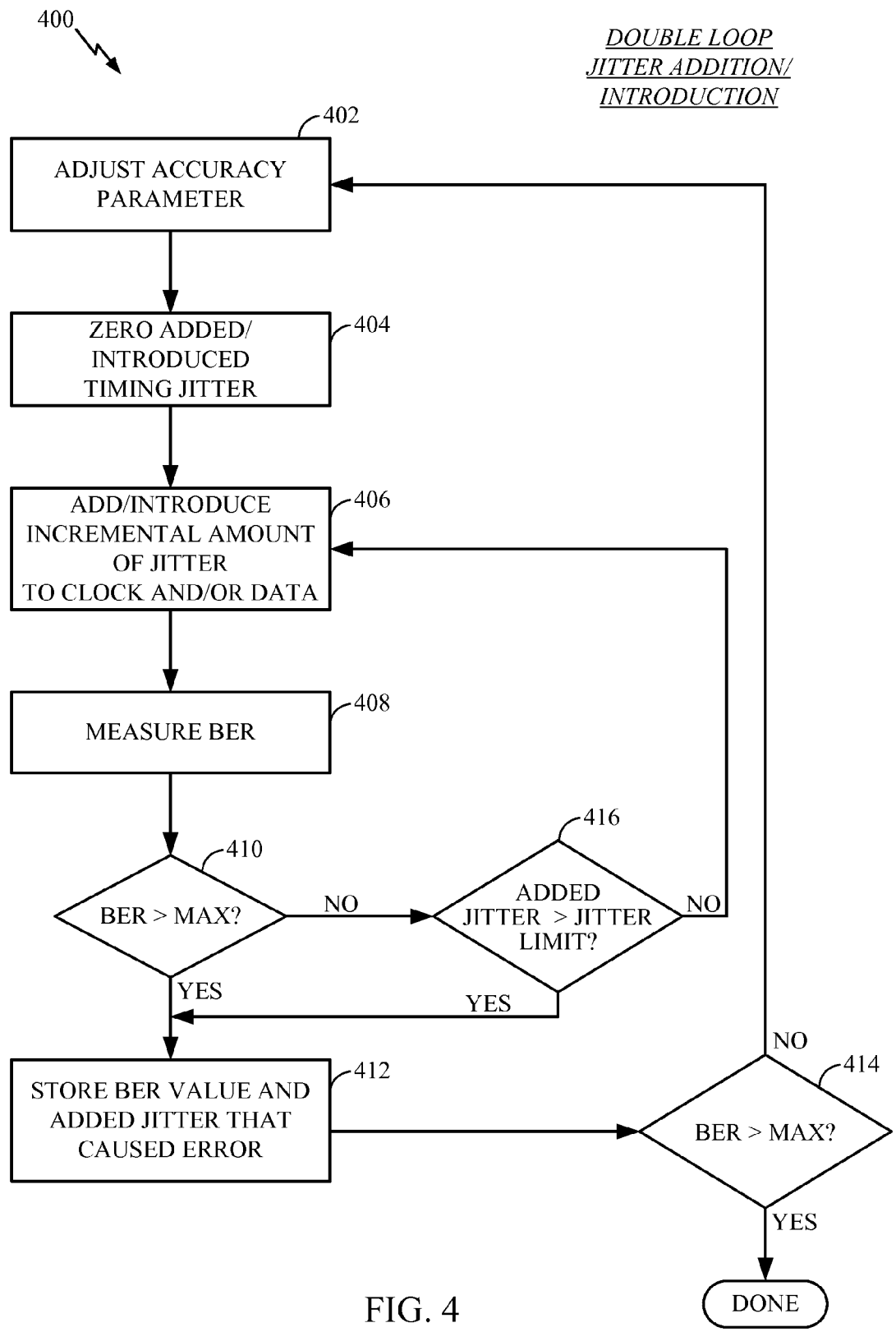
FIG. 4 is flowchart illustrating double loop jitter addition/introduction according to one or more implementations of the technology described herein.

FIG. 4 is a flowchart illustrating a method 400 of double loop jitter introduction in the platform write path 100 and the platform read path 200 (collectively "the platform") according to one or more implementations of the technology described herein. Measurement of the bit error rate (BER), introducing intentional jitter, and checking the bit error rate (BER) against the thresholds may be performed during platform operation (e.g., with mission mode live data traffic). Live traffic may be stopped temporarily during the time when the parameter setting is being reset.

In one or more implementations, the method 400 provides a mechanism to adjust the power consumption and bit error rate (BER) using a dynamic "double loop" approach. An outer loop includes blocks 402, 404, 406, 408, 410, 412, 414, and 416 of the method 400. An inner loop includes blocks 406, 408, 410, and 416 of the method 400.

The inner loop (blocks 406, 408, 410, and 416) implements an introduced jitter mechanism that is designed to incrementally increase jitter until either a maximum value of jitter is exceeded or a target BER is exceeded. Artificially inserting jitter introduces bit errors in the same way that random jitter would. This mechanism allows the method 400 to provide a bit error rate (BER) threshold and power level, that once set should not change due to random jitter because random jitter has already been taken into account.

Without the inner loop (blocks 406, 408, 410, and 416), the method 400 has to perform the outer loop (blocks 402, 404, 406, 408, 410, 412, 414, and 416) for an extended period of time in order to obtain a bit error rate (BER) and power consumption at a particular level. This is because random jitter is accounted for after the accuracy parameter is adjusted.

The inner loop (blocks 406, 408, 410, and 416) allows random jitter to be accounted for rapidly and under controlled conditions. Increased accuracy may be obtained by compensating for the amounts of artificially induced jitter in response to sensor provided information, such as platform temperature (e.g., hot versus cold), clock source (e.g., stable phase-locked loop (PLL) versus simple crystal oscillator), and power source (e.g., high current pulse-width modulated (PWM) versus low current pulse-frequency modulated (PWM)).

Figure 5:
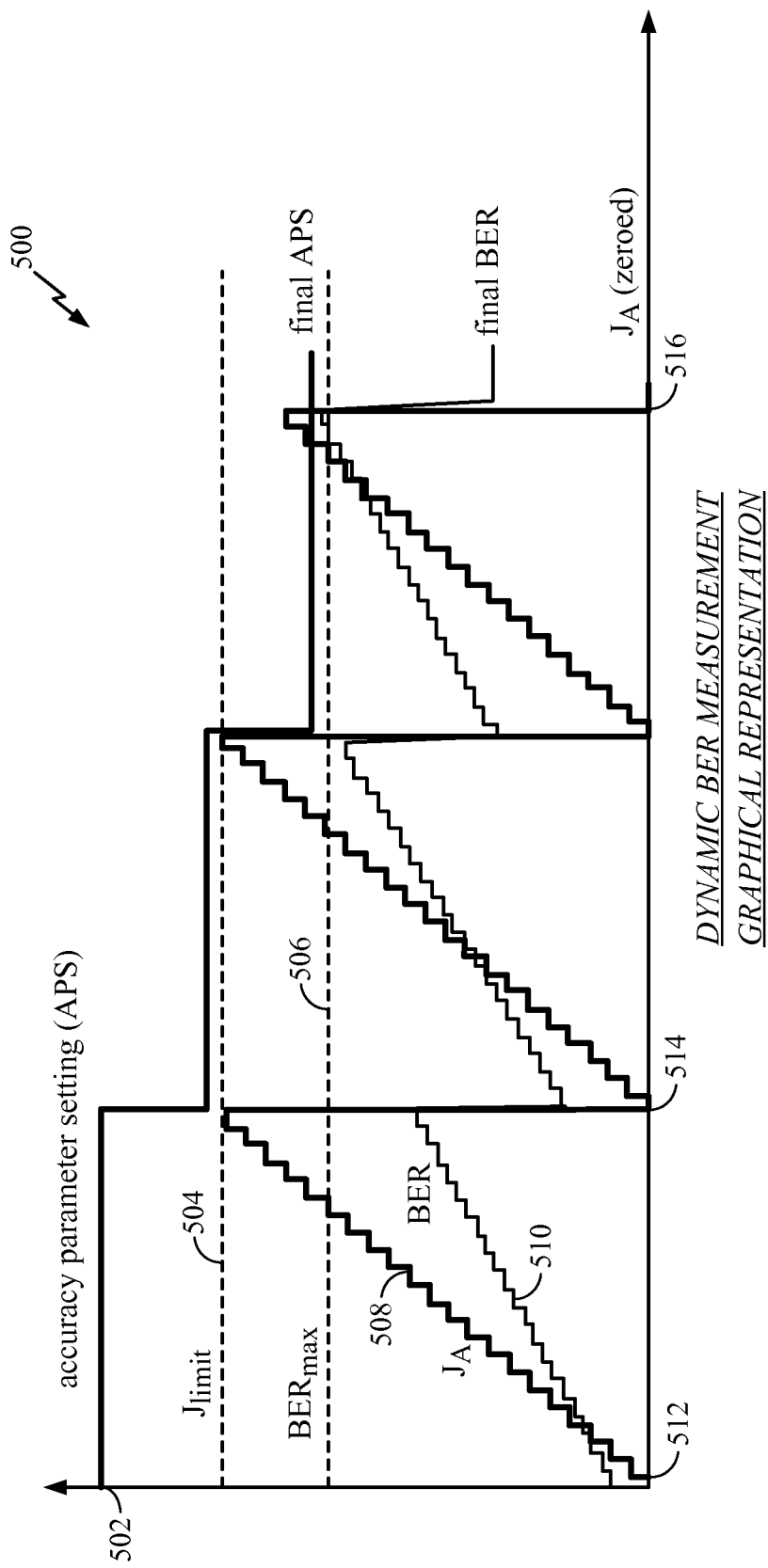
FIG. 5 is a graphical representation of dynamic bit error rate (BER) measurement according to one or more implementations of the technology described herein.

The method 400 is described with reference to FIG. 5, which is a graphical representation 500 of dynamic bit error rate (BER) measurement according to one or more implementations of the technology described herein. In the illustrated implementation, the graphical representation 500 includes an accuracy parameter curve 502, a jitter limit curve 504, a bit error rate (BER) limit curve 506, an added jitter $J_A$ curve 508, and a bit error rate (BER) curve 510.

In a block 402, the method 400 adjusts an accuracy parameter. Graphical representation 500 shows that the accuracy parameter represented by the accuracy parameter curve 502 is set to an initial value at a point 512. Accuracy parameters are described below.

In a block 404, the method 400 zeroes added/introduced timing jitter. The bit error rate (BER) may initially be measured without any introduced jitter. In one or more implementations, jitter is introduced into the clock and/or data. Graphical representation 500 shows that added jitter $J_A$ curve 508 is set to zero at point 512. Graphical representation 500 shows that bit error rate (BER) curve 510 has some random jitter at point 512.

If the bit error rate (BER) is acceptable, then in a block 406 the method 400 adds an incremental amount of jitter to the platform. Added jitter $J_A$ curve 508 shows that jitter is added between point 512 and a point 514 in the graphical representation 500.

In a block 408, the method 400 measures the bit error rate (BER). If it is determined in a block 410 that the bit error rate (BER) does not exceed a maximum threshold, and if it is determined in a block 416 that the added jitter has not exceeded a jitter limit, then the method 400 repeats block 406 and adds another incremental amount of introduced jitter.

If, on the other hand, it is determined in block 410 the bit error rate (BER) exceeds the maximum threshold or in block 416 that the added jitter exceeds the jitter limit, then at block 412 the values of the bit error rate (BER) and the added jitter are stored, in a table, for example.

Graphical representation 500 shows that bit error rate (BER) curve 510 has not exceeded the bit error rate (BER) maximum threshold as indicated by bit error rate (BER) limit curve 506 at point 514.

In a block 414, the method 400 determines whether the bit error rate (BER) exceeding the maximum threshold is the reason for exiting the inner loop. If the bit error rate (BER) having exceeded its maximum threshold is the reason for the method 400 exiting the inner loop, then no more jitter is introduced in the platform and the method 400 is done.

If, on the other hand, the incremental amount of jitter introduced in block 406 caused the jitter to exceed the jitter limit in block 416 and exit the inner loop, then the method 400 returns to block 402 and the accuracy parameter is adjusted.

Graphical representation 500 shows that added jitter $J_A$ curve 508 has reached but not exceeded the added jitter maximum threshold as indicated by jitter limit curve 504 at point 514. As such, at point 514, the accuracy parameter is adjusted downward and the method 400 is repeated until at a point 516 the bit error rate (BER) curve 510 finally exceeds the bit error rate (BER) limit 506. This point corresponds to the final accuracy parameter setting and has resulted in achieving the target bit error rate (BER). The added jitter is then zeroed at point 516 allowing the platform to tolerate an amount of random jitter matching the artificially induced jitter used in the previous blocks of the method 400.

In effect, if the measured bit error rate (BER) does not exceed the bit error rate (BER) threshold value and the first amount of introduced jitter does not exceed the jitter threshold value, then the method 400 operates by increasing an amount of jitter introduced into the platform until the bit error rate (BER) in the platform exceeds the BER threshold value and the amount of jitter introduced into the platform exceeds the jitter threshold value. If the measured bit error rate (BER) does not exceed the bit error rate (BER) threshold value and the first amount of introduced jitter exceeds the jitter threshold value, then the method 400 operates by adjusting the accuracy parameter and increasing an amount of jitter introduced into the platform until the bit error rate (BER) in the platform exceeds the BER threshold value and the amount of jitter introduced into the platform exceeds the jitter threshold value.

Accuracy Parameters

As described above, accuracy parameters may be set to an initial value and then adjusted to control power consumption in the platform. In one or more implementations, there are a variety of different accuracy parameters, knobs, if you will, that may be adjusted to control power consumption and accuracy (i.e., the amount of errors).

In one implementation, the multiphase modulators/transmitters 116 and/or 214 implement three-phase signaling. The skew between the three-phase wires on the multiphase modulators/transmitters 116 and/or 214 may be adjusted. For example, the skew may be relaxed or tightened. If the skew between the three-phase wires is relaxed, the platform would consume less power however, the accuracy may be worsened. In contrast, if the skew between the three-phase wires is tightened, the platform may consume more power but the accuracy may be improved.

The transmitter drive strength in the multiphase modulators/transmitters 116 and/or 214 may be adjusted to control power consumption and accuracy in the platform. For example, if the transmitter drive strength is increased, the power consumption may be worsened but the accuracy may improve. In contrast, if the transmitter drive strength is decreased, the power consumption is improved but the accuracy may be worsened.

The receiver termination resistance in the multiphase modulators/receivers 120 and/or 218 may be adjusted to control power consumption and accuracy in the platform. For example, if the receiver termination resistance is increased, the power consumption may improve but the accuracy may worsen. In contrast, if the receiver termination resistance is decreased, the power consumption is worsened but the accuracy may improve.

The transmitter termination resistance in the multiphase modulators/receivers 120 and/or 218 may be adjusted to control power consumption and accuracy in the platform. For example, if the transmitter termination resistance is increased, the power consumption may improve but the accuracy may worsen. In contrast, if the transmitter termination resistance is decreased, the power consumption is worsened but the accuracy may improve.

There are a number of different analog circuits that in the platform, such as phase locked loop (PLL) voltage controlled oscillator(s) (VCO) and current-controlled oscillator(s) (ICO). In one or more implementations, the bias to the PLL VCO or ICO may be increased by supplying more current. Increasing the bias may improve the clock generator accuracy, but may worsen the power consumption. In contrast, decreasing the bias may worsen the clock generator accuracy but may improve the power consumption.

There are a number of different calibrated delay elements in the platform. In one or more implementation, the accuracy of the delay elements may be improved by putting more current into the circuit; however, the power consumption would be worsened. In contrast, the accuracy of the delay elements may be worsened by putting less current into the circuit; however, the power consumption would be improved.

The same is true for any reference voltages in the platform. To improve the accuracy, the stability drift, and the noise on a voltage reference, more current may be provided to the circuit that provides the reference voltage. Providing more current may improve the accuracy but may worsen the power consumption.

In one or more implementations, selectively enabling and disabling transmitter emphasis and receiver equalization may improve accuracy. However, enabling those circuits may worsen the power consumption.

In one or more implementations, enabling crosstalk cancellation may also improve accuracy, but worsen power consumption. Enabling duty cycle correction could also worsen the power consumption, but improve the accuracy.

Three-Phase Symbol Mapping and Error Detection

In one or more implementations, the modulation of the signals over the channels 118 and 216 are dynamically adjusted in order to control accuracy and power consumption. For example, by using more complex mapping and encoding the accuracy may improve, but the power consumption may worsen. In contrast, by using mapping and encoding that is less complex, the accuracy may worsen, but the power consumption may improve. In one or more implementations, phase rotation, coding techniques, and/or mapping techniques may be adjusted to obtain different power levels in the platform.

Figure 6:
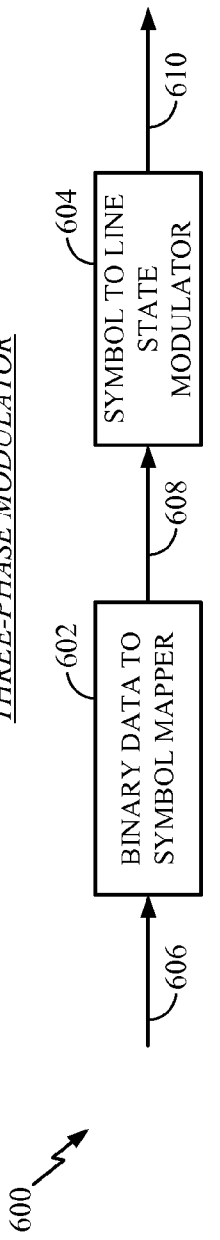
FIG. 6 is a block diagram illustrating three-phase mapping and error code generation according to one or more implementations of the technology described herein.

FIG. 6 is a block diagram illustrating a three-phase modulator 600 according to one or more implementations of the technology described herein. In one or more implementations, the three-phase modulator 600 includes different types of rotators, coding techniques, and mappers. Optimization of power consumption may be accomplished over the multiphase multilane memory bus by switching between different types of rotators, coding techniques, and mappers.

The illustrated three-phase modulator 600 may be the modulation portion of the multiphase modulators/transmitters 116 and/or 214. The illustrated three-phase modulator 600 includes a binary data to symbol mapper 602 and a symbol to line state modulator 604.

In the illustrated implementation, the symbol mapper 602 receives an input 606, which is binary data. The symbol mapper 602 outputs three-phase input symbols to the symbol to line state modulator 604. The symbol to line state modulator 604 further modulates the three-phase input symbols to three-phase line states. The three-phase line states are sent through a driver and over the channel 118 and/or 216.

In one or more implementations, one mechanism to save power is by using different schemes. For example, an accurate, robust scheme is less immune to errors than a power efficient scheme. By having more complex mapping and encoding (i.e., more accurate and robust coding) power consumption is improved. In contrast, sending the data straight through the channel 118 and/or 216 with virtually no mapping or encoding (power efficient) may be made to conserve power and again worsen the bit error rate (BER).

Figure 7:
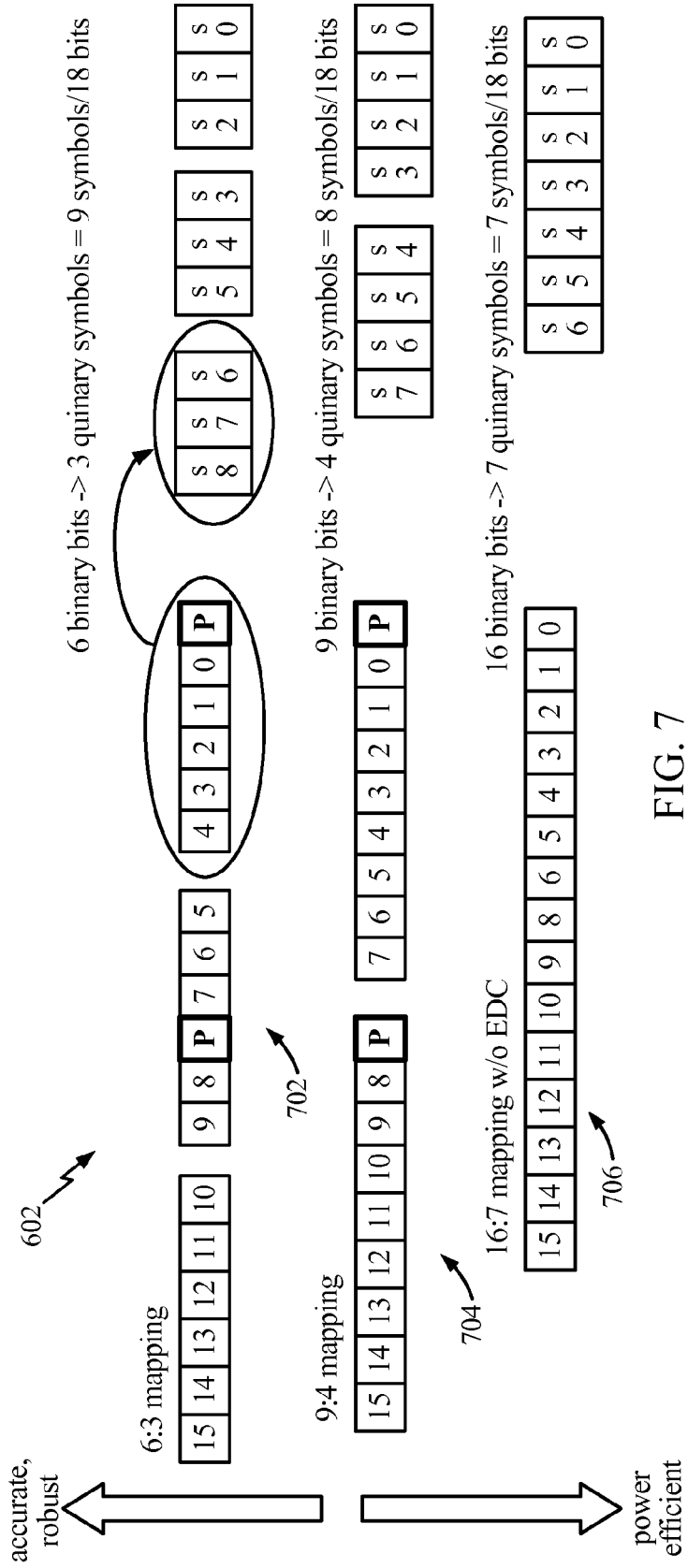
FIG. 7 illustrates the binary data to symbol mapper depicted in FIG. 6 according to one or more implementations of the technology described herein.

FIG. 7 illustrates mapping by the symbol mapper 602 according to one or more implementations of the technology described herein. FIG. 7 shows three different schemes, going from accurate and robust to power efficient.

For example, a scheme 702 is a 6:3 mapping scheme that maps sixteen binary bits (0-15) into nine three-phase symbols (S0-S8). The mapping has inserted parity bits (P) in creating the nine three-phase symbols (S0-S8).

A scheme 704 is a 9:4 mapping scheme that maps sixteen binary bits (0-15) into eight three-phase symbols (S0-S7). The mapping has inserted parity bits (P) in creating the eight three-phase symbols (S0-S7).

A scheme 706 is a 16:7 mapping scheme that maps sixteen binary bits (0-15) into seven three-phase symbols (S0-S6). The mapping does not use parity bits (P) in creating the eight three-phase symbols (S0-S7).

In all three schemes, the same amount of data (16-bits) is conveyed. However, accurate schemes relay them with more symbols while power efficient schemes relay them with fewer symbols. The illustrated scheme 702 is more accurate and robust than the illustrated scheme 704. Therefore, the scheme 702 consumes more power than the scheme 704. Likewise, the scheme 704 is more accurate and robust than the scheme 706. Therefore, the scheme 704 consumes more power than the scheme 706. In the scheme 706, no error detection codes are applied to the data and as a result the scheme 706 is more power efficient than the schemes 702 and/or 704.

The schemes 702, 704, and 706 may also be applied to either binary data using the symbol mapper 602 or to the three-phase symbols after the symbol mapper 602. For example, the error detection code may be inserted into raw binary data using the symbol mapper 602. In an alternative implementation, error detection symbols may be appended to the three-phase symbols themselves using the symbol mapper 602. In this manner, power consumption and bit error rate (BER) may be adjusted significantly through the use of different mapping and error detection schemes.

Figure 8:
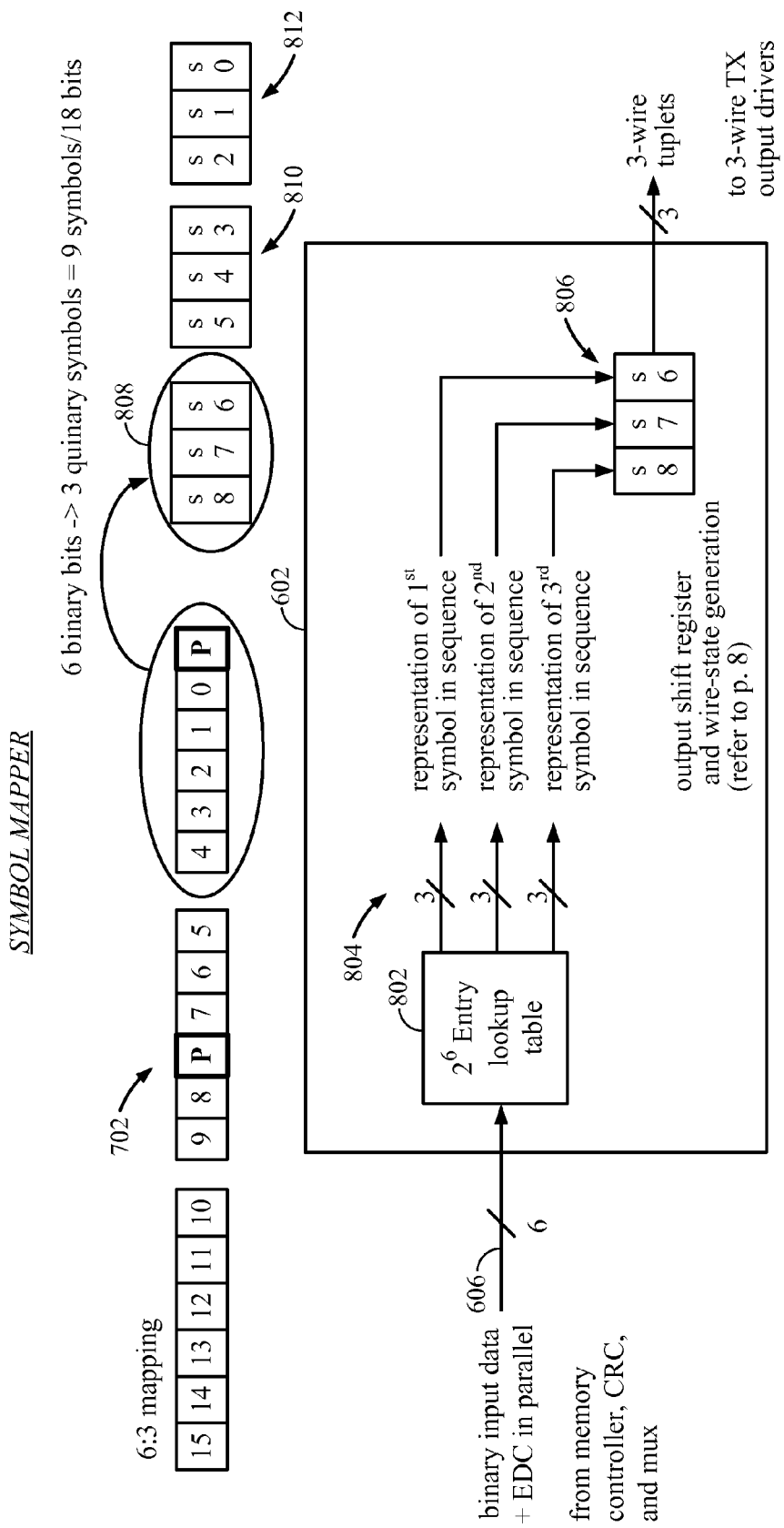
FIG. 8 illustrates the binary to quinary mapping using the data to symbol mapper depicted in FIG. 6 according to one or more implementations of the technology described herein.

FIG. 8 illustrates the binary to quinary mapping using the symbol mapper 602 according to one or more implementations of the technology described herein. In the illustrated implementation, raw data along with the parity bits are input into the symbol mapper 602. For every six raw binary bits three three-phase symbols are created. A total of sixteen bits plus two parity bits creates nine total symbols.

In one or more implementations, the nine total symbols are created using a mapping table 802, which is a $2^6$ entry lookup table. The six binary bits are input to the mapping table 802, which creates quinary symbols 804. The quinary symbols 804 are shifted out serially in a block 806.

One of the advantages of three-phase modulation is that the sixteen binary bits (0-15) are mapped into the smaller number of nine three-phase symbols (S0-S8). The resulting three wire tuplets 808, 810, and 812 are shifted out of the symbol mapper 602 and line state modulator 604 and then sent to the transmit output drivers in the multiphase modulators/transmitters 116 and/or 214.

FIGS. 9A, 9B, and 9C illustrate generation of three-phase wire states using the line state modulator 604 according to one or more implementations of the technology described herein.

FIG. 9A depicts a transmitter (TX) 902 and a receiver (Rx) 904. The line state modulator 604 is a multiphase modulator.

In at least one implementation, the line state modulator 604 is a three-phase modulator. In this implementation, the line state modulator 604 uses three wires 906, 908, and 910 representing phases A, B, and C. The wire state on any of these three wires 906, 908, and 910 may be any state, such as −x, +x, −y, +y, −z, +z.

FIG. 9B is a transition diagram 912 that pictorially shows that the wire state on any of the three wires 906, 908, and 910 may be any state, such as −x, +x, −y, +y, −z, +z. The allowed transitions from a current wire state to a next wire state are shown using arrows. In this example, successive wire states cannot remain the same (because there are no arrows which begin and end in the same state).

FIG. 9C depicts a table 914, which describes wire state transitions on the three wires 906, 908, and 910 of FIG. 9B in tabular form. Table 914 illustrates a previous wire state for the three wires 906, 908, and 910 and a next wire state for the three wires 906, 908, and 910. In table 914, the three values in brackets {000} correspond to the three wires 906, 908, and 910 representing phases {A, B, C}. For each symbol, the wire state may transition to any state other than back to its current state.

Table 914 includes a column 916 that indicates a symbol input value corresponding to the outputs from the symbol mapper 602 in FIG. 6. For each symbol value the line state modulator 604 determines the current wire state and based on that symbol value the line state modulator 604 branches to a new wire state.

In one or more implementations, the modulator 600 includes different types of wire state transitions, coding techniques, and mappers. Optimization of power consumption is accomplished over the multiphase multilane memory bus by switching between different types of wire state transitions, coding techniques, and mappers.

Figure 10:
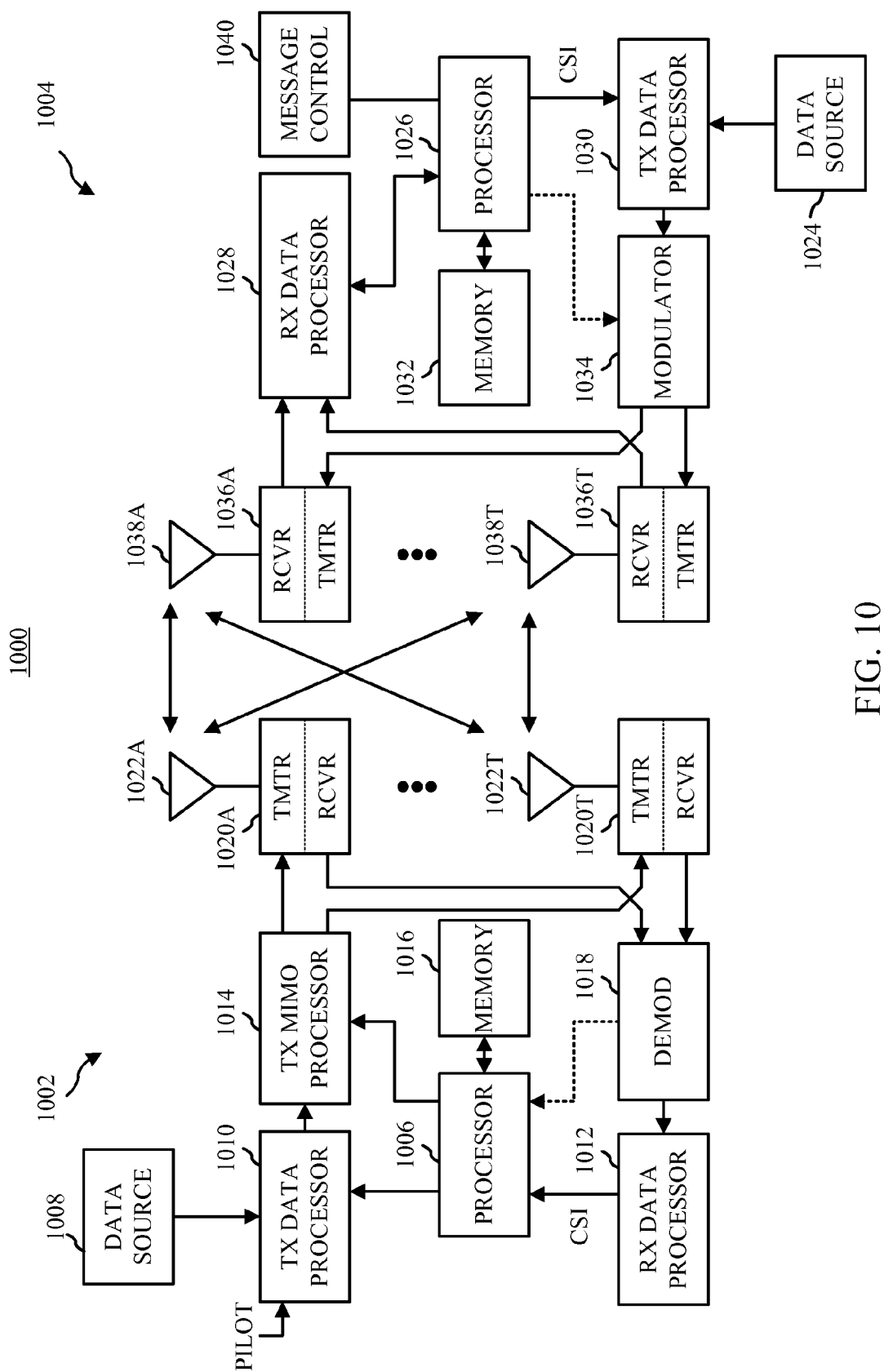
FIG. 10 is a platform wherein the technology disclosed herein may be deployed according to implementations described herein.

FIG. 10 is a block diagram of a platform 1000 in which the technology described herein may be implemented. The platform 1000 includes a user device 1002 and a base station 1004.

In the illustrated implementation, the user device 1002 includes a processor 1006, a data source 1008, a transmit (TX) data processor 1010, a receive (RX) data processor 1012, a transmit (TX) (multiple-input multiple-output (MIMO) processor 1014, a memory 1016, a demodulator (DEMOD) 1018, several transceivers 1020A through 1020T, and several antennas 1022A through 1022T.

In the illustrated implementation, the user device 1002 includes a data source 1024, a processor 1026, a receive data processor 1028, a TX data processor 1030, a memory 1032, a modulator 1034, several transceivers 1036A through 1036T, several antennas 1038A through 1038T, and a message control module 1040.

The illustrated user device 1002 may comprise, be implemented as, or known as user equipment, a subscriber station, a subscriber unit, a mobile station, a mobile, a mobile node, a remote station, a remote terminal, a user terminal, a user agent, a user device, or some other terminology. In some implementations, the user device 1002 may be a cellular telephone, a cordless telephone, a session initiation protocol (SIP) phone, a wireless local loop (WLL) station, a personal digital assistant (PDA), a handheld device having wireless connection capability, or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music device, a video device, or a satellite radio), a global positioning system device, or any other suitable device that is configured to communicate via a wireless medium.

The illustrated base station 1004 may comprise, be implemented as, or known as a NodeB, an eNodeB, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other similar terminology.

The illustrated data source 1008 provides traffic for a number of data streams to the transmit (TX) data processor 1010.

The transmit (TX) data processor 1010 formats, codes, and interleaves the traffic data for each data stream based on a particular coding scheme selected for that data stream to provide coded data. The coded data for each data stream may be multiplexed with pilot data using OFDM techniques.

The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols.

The data rate, coding, and modulation for each data stream may be determined by instructions performed by the transmit (TX) data processor 1010. The memory 1016 may store program code, data, and other information used by the transmit (TX) data processor 1010 or other components of the user device 1002.

The modulation symbols for all data streams are then provided to the transmit (TX) (multiple-input multiple-output (MIMO) processor 1014, which may further process the modulation symbols (e.g., for OFDM). The transmit (TX) (multiple-input multiple-output (MIMO) processor 1014 then provides $N_T$ modulation symbol streams to the $N_T$ transceivers (XCVR) 1020A through 1020T. In some implementations, the transmit (TX) (multiple-input multiple-output (MIMO) processor 1014 applies beam-forming weights to the symbols of the data streams and to the antenna from which the symbol is being transmitted.

Each transceiver (XCVR) 1020A through 1020T receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transceivers (XCVR) 1020A through 1020T are then transmitted from $N_T$ antennas 1022A through 1022T, respectively.

At the base station 1004, the transmitted modulated signals are received by $N_R$ antennas 1038A through 1038R and the received signal from each antenna 1038A through 1038R is provided to a respective transceiver (XCVR) 1036A through 1036R. Each transceiver (XCVR) 1036A through 1036R conditions (e.g., filters, amplifies, and downconverts) a respective received signal, digitizes the conditioned signal to provide samples, and further processes the samples to provide a corresponding "received" symbol stream.

The receive (RX) data processor 1028 then receives and processes the $N_R$ received symbol streams from the $N_R$ transceivers (XCVR) 1036A through 1036R based on a particular receiver processing technique to provide $N_T$ "detected" symbol streams. The receive (RX) data processor 1028 then demodulates, deinterleaves, and decodes each detected symbol stream to recover the traffic data for the data stream. The processing by the receive (RX) data processor 1028 is complementary to that performed by the transmit (TX) (multiple-input multiple-output (MIMO) processor 1014 and the transmit (TX) data processor 1010 at the user device 1002.

The processor 1026 periodically determines which pre-coding matrix to use (discussed below). The processor 1026 formulates a reverse link message comprising a matrix index portion and a rank value portion.

The memory 1032 may store program code, data, and other information used by the processor 1026 or other components of the base station 1004.

The reverse link message may comprise various types of information regarding the communication link and/or the received data stream. The reverse link message is then processed by a TX data processor 1030, which also receives traffic data for a number of data streams from the data source 1024, modulated by the modulator 1034, conditioned by the transceivers (XCVR) 1036A through 1036R, and transmitted back to the user device 1002.

At the user device 1002, the modulated signals from the base station 1004 are received by the antennas 1022A through 1022T, conditioned by the transceivers (XCVR) 1020A through 1020R, demodulated by a demodulator (DEMOD) 1018, and processed by the receive (RX) data processor 1012 to extract the reverse link message transmitted by the base station 1004. The transmit (TX) data processor 1010 then determines which pre-coding matrix to use for determining the beam-forming weights then processes the extracted message.

It should be appreciated that for the user device 1002 and the base station 1004 the functionality of two or more of the described components may be provided by a single component. For example, a single processing component may provide the functionality of the message control module 1040 and the processor 1026.

It also should be appreciated that a wireless node may be configured to transmit and/or receive information in a non-wireless manner (e.g., via a wired connection). Thus, a receiver and a transmitter as discussed herein may include appropriate communication interface components (e.g., electrical or optical interface components) to communicate via a non-wireless medium.

The platform 1000 may implement any one or combinations of the following technologies: Code Division Multiple Access (CDMA) systems, Multiple-Carrier CDMA (MC-CDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein may be designed to implement one or more standards, such as IS-97, cdma2000, IS-876, W-CDMA, TDSCDMA, and other standards.

A CDMA network may implement a radio technology such as Universal Terrestrial Radio Access (UTRA), cdma2000, or some other technology. UTRA includes W-CDMA and Low Chip Rate (LCR). The cdma2000 technology covers IS-2000, IS-97, and IS-876 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS).

The teachings herein may be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2).

Although certain aspects of the disclosure may be described using 3GPP terminology, it is to be understood that the teachings herein may be applied to 3GPP (e.g., Rel99, Re17, Re16, Rel7) technology, as well as 3GPP2 (e.g., 1×RTT, 1×EV-DO Re10, RevA, RevB) technology and other technologies.

Aspects of the technology described herein are disclosed in the following description and related drawings directed to specific implementations of the technology described herein. Alternative implementations may be devised without departing from the scope of the technology described herein. Additionally, well-known elements of the technology described herein will not be described in detail or will be omitted so as not to obscure the relevant details of the technology described herein.

The term "implementations of the technology described herein" does not require that all implementations of the technology described herein include the discussed feature, advantage, or mode of operation.

The terminology used herein is for the purpose of describing particular implementations only and is not intended to be limiting of implementations of the technology described herein. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many implementations are described in terms of sequences of actions to be performed by, for example, elements of a computing device. It will be recognized that various actions described herein can be performed by specific circuits (e.g., application specific ICs (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the technology described herein may be embodied in a number of different forms, all of which have been contemplated to be within the scope of the claimed subject matter. In addition, for each of the implementations described herein, the corresponding form of any such implementations may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall platform. Skilled artisans may implement the described functionality in varying ways for each particular application, but such implementation decisions should not be interpreted as causing a departure from the scope of the present technology described herein.

The methods, sequences, and/or algorithms described in connection with the implementations disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an implementation of the technology described herein can include a computer-readable media embodying a method of manufacturing a semiconductor device. Accordingly, the technology described herein is not limited to illustrated examples, and any means for performing the functionality described herein are included in implementations of the technology described herein.

While the foregoing disclosure shows illustrative implementations of the technology described herein, it should be noted that various changes and modifications could be made herein without departing from the scope of the technology described herein as defined by the appended claims. The functions, steps, and/or actions of the method claims in accordance with the implementations of the technology described herein described herein need not be performed in any particular order. Furthermore, although elements of the technology described herein may be described or claimed in the singular, the plural is contemplated unless limitation to the singular is explicitly stated.

What is claimed is:

1. A method for optimizing power consumption in a platform having a multilane, multiphase wired bus, the method comprising:
   setting an accuracy parameter for the platform;
   introducing a first predetermined amount of jitter into the platform;
   measuring a bit error rate (BER) in the multilane, multiphase wired bus of the platform;
   determining whether the measured BER exceeds a minimum BER threshold value;
   if the measured BER does not exceed the minimum BER threshold value, then adjusting the accuracy parameter to decrease an accuracy of the platform;
   determining whether the measured BER in the platform exceeds a maximum BER threshold value;
   determining whether the first amount of jitter exceeds a jitter threshold value;
   if the measured BER does not exceed the maximum BER threshold value and the first predetermined amount of introduced jitter does not exceed the jitter threshold value, then increasing an amount of jitter introduced into the platform until the BER in the platform exceeds the maximum BER threshold value and the amount of jitter introduced into the platform exceeds the jitter threshold value; and
   if the measured BER does not exceed the maximum BER threshold value and the first predetermined amount of introduced jitter exceeds the jitter threshold value, then adjusting the accuracy parameter and increasing the amount of jitter introduced into the platform until the BER in the platform exceeds the maximum BER threshold value and the amount of jitter introduced into the platform exceeds the jitter threshold value.

2. The method of claim 1, wherein setting the accuracy parameter includes setting a coding scheme for the multilane, multiphase wired bus and wherein the multilane, multiphase wired bus is a multilane, multiphase memory bus configured to enable writing to and reading from a memory.

3. The method of claim 2, wherein adjusting the accuracy parameter includes dynamically adjusting the coding scheme during operation of the platform.

4. The method of claim 3, wherein adjusting the accuracy parameter includes adjusting the coding scheme during operation of the platform.

5. The method of claim 1, wherein setting the accuracy parameter includes setting an error correction scheme for the multilane, multiphase wired bus.

6. The method of claim 5, wherein adjusting the accuracy parameter includes dynamically adjusting the error correction scheme during operation of the platform.

7. The method of claim 1, wherein the platform includes at least one of a system on chip (SoC) and the multilane, multiphase wired bus is a multilane, multiphase memory bus configured to enable writing to and reading from a dynamic random access memory (DRAM).

8. An apparatus for optimizing power consumption in a platform having a multilane, multiphase wired bus, the apparatus comprising:
logic that is configured to set an accuracy parameter for the platform;
logic that is configured to introduce a first predetermined amount of jitter into the platform;
logic that is configured to measure a bit error rate (BER) in the multilane, multiphase wired bus of the platform;
logic that is configured to determine whether the measured BER exceeds a minimum BER threshold value;
logic that is configured to, if the measured BER does not exceed the minimum BER threshold value, adjust the accuracy parameter to decrease an accuracy of the platform;
logic that is configured to determine whether the measured BER in the platform exceeds a maximum BER threshold value;
logic that is configured to determine whether the first predetermined amount of jitter exceeds a jitter threshold value;
logic that is configured to, if the measured BER does not exceed the maximum BER threshold value and the first predetermined amount of introduced jitter does not exceed the jitter threshold value, increase an amount of jitter introduced into the platform until the BER in the platform exceeds the maximum BER threshold value and the amount of jitter introduced into the platform exceeds the jitter threshold value; and
logic that is configured to, if the measured BER does not exceed the maximum BER threshold value and the first predetermined amount of introduced jitter exceeds the jitter threshold value, adjust the accuracy parameter and increase the amount of jitter introduced into the platform until the BER in the platform exceeds the maximum BER threshold value and the amount of jitter introduced into the platform exceeds the jitter threshold value.

9. The apparatus of claim 8, wherein the accuracy parameter includes at least one of a coding scheme, an error correction scheme, or a mapping scheme and wherein the multilane, multiphase wired bus is a multilane, multiphase memory bus configured to enable writing to and reading from a memory.

10. The apparatus of claim 8, wherein the platform includes at least one of a system on chip (SoC) and the multilane, multiphase wired bus is a multilane, multiphase memory bus configured to enable writing to and reading from a dynamic random access memory (DRAM).

11. The apparatus of claim 8, further comprising:
logic that is configured to provide data;
logic that is configured to provide a check value for the data;
logic that is configured to provide a code word having the data and the check value; and
logic that is configured to modulate the code word and to transmit the code word to the multilane, multiphase wired bus at the measured BER.

12. The apparatus of claim 8, further comprising:
logic that is configured to obtain a code word from the multilane, multiphase wired bus, wherein the code word includes a check value, and wherein the code word is obtained at the measured BER;
logic that is configured to remove the check value from the code word;
logic that is configured to demodulate and transmit the code word across a channel at the measured BER.

13. The apparatus of claim 8, wherein the multilane, multiphase wired bus is a three-phase bus and wherein the logic that is configured to set the accuracy parameter for the platform includes logic that is configured to set a skew between three-phase wires associated with the multilane, multiphase wired bus.

14. A method for optimizing power consumption in a platform having a multilane, multiphase wired bus, the method comprising:
setting an accuracy parameter for the platform;
introducing a first predetermined amount of jitter into the platform;
measuring a bit error rate (BER) in the multilane, multiphase wired bus of the platform;
determining whether the measured BER exceeds a minimum BER threshold value;
if the measured BER does not exceed the minimum BER threshold value, then adjusting the accuracy parameter to decrease an accuracy of the platform;
determining whether the measured BER in the platform exceeds a maximum BER threshold value;
determining whether the first amount of jitter exceeds a jitter threshold value;
if the measured BER does not exceed the maximum BER threshold value and the first predetermined amount of introduced jitter does not exceed the jitter threshold value, then increasing an amount of jitter introduced into the platform until the BER in the platform exceeds the maximum BER threshold value and the amount of jitter introduced into the platform exceeds the jitter threshold value; and
if the measured BER does not exceed the maximum BER threshold value and the first predetermined amount of introduced jitter exceeds the jitter threshold value, then adjusting the accuracy parameter and increasing the amount of jitter introduced into the platform until the BER in the platform exceeds the maximum BER threshold value and the amount of jitter introduced into the platform exceeds the jitter threshold value.

15. The method of claim 14, wherein the setting the accuracy parameter includes setting a coding scheme for the multilane, multiphase wired bus and wherein the multilane, multiphase wired bus is a multilane, multiphase memory bus configured to enable writing to and reading from a memory.

16. The method of claim 15, wherein the adjusting the accuracy parameter includes dynamically adjusting the coding scheme during operation of the platform.

17. The method of claim 16, wherein the adjusting the accuracy parameter includes dynamically adjusting the coding scheme during operation of the platform.

18. The method of claim 14, wherein the setting the accuracy parameter includes setting an error correction scheme for the multilane, multiphase wired bus.

19. The method of claim 18, wherein the adjusting the accuracy parameter includes dynamically adjusting the error correction scheme during operation of the platform.

20. The method of claim 14, wherein the platform includes at least one of a system on chip (SoC) and the multilane, multiphase wired bus is a multilane, multiphase memory bus configured to enable writing to and reading from a dynamic random access memory (DRAM).

21. An apparatus for optimizing power consumption in a platform having a multilane, multiphase wired bus, the apparatus comprising:
  means for setting an accuracy parameter for the platform;
  means for introducing a first predetermined amount of jitter into the platform;
  means for measuring a bit error rate (BER) in the multilane, multiphase wired bus of the platform;
  means for determining whether the measured BER exceeds a minimum BER threshold value;
  means for, if the measured BER does not exceed the minimum BER threshold value, adjusting the accuracy parameter to decrease an accuracy of the platform;
  means for determining whether the measured BER in the platform exceeds a maximum BER threshold value;
  means for determining whether the first amount of jitter exceeds a jitter threshold value;
  means for, if the measured BER does not exceed the maximum BER threshold value and the first predetermined amount of introduced jitter does not exceed the jitter threshold value, increasing an amount of jitter introduced into the platform until the BER in the platform exceeds the maximum BER threshold value and the amount of jitter introduced into the platform exceeds the jitter threshold value; and
  means for, if the measured BER does not exceed the maximum BER threshold value and the first predetermined amount of introduced jitter exceeds the jitter threshold value, then adjusting the accuracy parameter and increasing the amount of jitter introduced into the platform until the BER in the platform exceeds the maximum BER threshold value and the amount of jitter introduced into the platform exceeds the jitter threshold value.

22. The apparatus of claim 21, wherein the means for setting the accuracy parameter includes means for setting a coding scheme for the multilane, multiphase wired bus and wherein the multilane, multiphase wired bus is a multilane, multiphase memory bus configured to enable writing to and reading from a memory.

23. The apparatus of claim 22, wherein the means for adjusting the accuracy parameter includes means for dynamically adjusting the coding scheme during operation of the platform.

24. The apparatus of claim 23, wherein the means for adjusting the accuracy parameter includes means for dynamically adjusting the coding scheme during operation of the platform.

25. The apparatus of claim 21, wherein the means for setting the accuracy parameter includes means for setting an error correction scheme for the multilane, multiphase wired bus.

26. The apparatus of claim 25, wherein the means for adjusting the accuracy parameter includes means for dynamically adjusting the error correction scheme during operation of the platform.

27. The apparatus of claim 21, wherein the platform includes at least one of a system on chip (SoC) and the multilane, multiphase wired bus is a multilane, multiphase memory bus configured to enable writing to and reading from a dynamic random access memory (DRAM).

28. The apparatus of claim 21, wherein the platform includes at least one multiphase modulator/transmitter configured to implement three-phase signaling on the multilane, multiphase wired bus, and wherein at least one parameter includes at least one of a skew between three-phase wires for the at least one multiphase modulator/transmitter, a transmitter drive strength for the at least one multiphase modulator/transmitter, or a transmitter termination resistance for the at least one multiphase modulator/transmitter.

29. The apparatus of claim 21, wherein the platform includes at least one multiphase demodulator/receiver configured to implement three-phase signaling on the multilane, multiphase wired bus, and wherein at least one parameter includes a receiver termination resistance for the at least one multiphase demodulator/receiver.

30. The apparatus of claim 21, wherein the platform includes at least one of:
  an analog circuit, and wherein at least one parameter includes at least one of a bias for the analog circuit;
  a calibrated delay element, and wherein the at least one parameter includes at least one of a drive current for the calibrated delay element; or
  a voltage reference, wherein the at least one parameter includes at least one of a current for the voltage reference.

* * * * *